United States Patent
Hozumi et al.

(10) Patent No.: US 12,209,996 B2
(45) Date of Patent: Jan. 28, 2025

(54) ULTRASONIC TESTING DEVICE AND ULTRASONIC TESTING METHOD

(71) Applicants: National University Corporation TOYOHASHI UNIVERSITY OF TECHNOLOGY, Toyohashi (JP); HAMAMATSU PHOTONICS K.K., Hamamatsu (JP)

(72) Inventors: Naohiro Hozumi, Toyohashi (JP); Takuto Matsui, Toyohashi (JP); Toru Matsumoto, Hamamatsu (JP); Shigeru Eura, Hamamatsu (JP)

(73) Assignees: National University Corporation TOYOHASHI UNIVERSITY OF TECHNOLOGY, Toyohashi (JP); HAMAMATSU PHOTONICS K.K., Hamamatsu (JP)

( * ) Notice: Subject to any disclaimer, the term of this patent is extended or adjusted under 35 U.S.C. 154(b) by 415 days.

(21) Appl. No.: 17/430,904

(22) PCT Filed: Jan. 28, 2020

(86) PCT No.: PCT/JP2020/003040
§ 371 (c)(1),
(2) Date: Aug. 13, 2021

(87) PCT Pub. No.: WO2020/174984
PCT Pub. Date: Sep. 3, 2020

(65) Prior Publication Data
US 2022/0163485 A1   May 26, 2022

(30) Foreign Application Priority Data
Feb. 26, 2019   (JP) .................. 2019-033084

(51) Int. Cl.
*G01N 29/34*   (2006.01)
*G01N 29/04*   (2006.01)
(Continued)

(52) U.S. Cl.
CPC ......... *G01N 29/348* (2013.01); *G01N 29/041* (2013.01); *G01N 29/043* (2013.01);
(Continued)

(58) Field of Classification Search
CPC ......... G01N 29/348; G01N 2291/0231; G01N 2291/2697; G01N 29/041; G01N 29/043;
(Continued)

(56) References Cited

U.S. PATENT DOCUMENTS

| | | | |
|---|---|---|---|
| 6,430,728 B1 | 8/2002 | Goruganthu et al. | |
| 10,955,458 B2 * | 3/2021 | Matsumoto | ......... G01R 31/303 |

(Continued)

FOREIGN PATENT DOCUMENTS

| | | |
|---|---|---|
| CN | 1608198 A | 4/2005 |
| CN | 102292627 A | 12/2011 |

(Continued)

OTHER PUBLICATIONS

Machine translation of WO 2018083904 A1 (Year: 2018).*
(Continued)

*Primary Examiner* — John E Breene
*Assistant Examiner* — Rose M Miller
(74) *Attorney, Agent, or Firm* — Faegre Drinker Biddle & Reath LLP

(57) ABSTRACT

An ultrasonic testing device having a packaged semiconductor device as a testing target, the device including: an ultrasonic oscillator disposed to face the semiconductor device; a pulse generator generating a driving signal that is used in the generation of an ultrasonic wave to be output from the ultrasonic oscillator; and an analysis unit analyzing (Continued)

an output signal that is output from the semiconductor device in accordance with the irradiation of the ultrasonic wave from the ultrasonic oscillator, in which the pulse generator sets an optimal frequency of the driving signal such that the absorption of the ultrasonic wave in the semiconductor device is maximized.

10 Claims, 11 Drawing Sheets

(51) Int. Cl.
G01N 29/26 (2006.01)
G01N 29/265 (2006.01)
G01N 29/44 (2006.01)
G01R 31/265 (2006.01)
G01R 31/27 (2006.01)
G01R 31/70 (2020.01)

(52) U.S. Cl.
CPC .......... *G01N 29/26* (2013.01); *G01N 29/265* (2013.01); *G01N 29/4463* (2013.01); *G01R 31/265* (2013.01); *G01R 31/275* (2013.01); *G01R 31/70* (2020.01); *G01N 2291/0231* (2013.01); *G01N 2291/2697* (2013.01)

(58) Field of Classification Search
CPC .. G01N 29/26; G01N 29/265; G01N 29/4463; G01R 31/70; G01R 31/265; G01R 31/275
USPC .......................................................... 73/627
See application file for complete search history.

(56) References Cited

U.S. PATENT DOCUMENTS

| | | | | |
|---|---|---|---|---|
| 11,105,777 | B2* | 8/2021 | Matsumoto | .......... G01N 29/225 |
| 11,408,863 | B2* | 8/2022 | Kannajosyula | ...... G01N 29/348 |
| 11,428,673 | B2* | 8/2022 | Matsumoto | ............ G01R 31/28 |
| 2011/0270070 | A1 | 11/2011 | Igarashi et al. | |
| 2014/0283610 | A1 | 9/2014 | Morioka et al. | |
| 2016/0054246 | A1 | 2/2016 | Nedwell | |
| 2016/0074017 | A1 | 3/2016 | Lee | |
| 2016/0238700 | A1 | 8/2016 | Matsuura et al. | |
| 2018/0003680 | A1* | 1/2018 | Kannajosyula | ........ G01N 29/46 |
| 2019/0011554 | A1 | 1/2019 | Greco et al. | |

FOREIGN PATENT DOCUMENTS

| | | | | |
|---|---|---|---|---|
| CN | 103222883 | A | | 7/2013 |
| CN | 103380386 | A | | 10/2013 |
| CN | 103575810 | A | | 2/2014 |
| CN | 104062358 | A | | 9/2014 |
| CN | 204731200 | U | | 10/2015 |
| CN | 105338908 | A | | 2/2016 |
| CN | 105705963 | A | | 6/2016 |
| CN | 106068515 | A | | 11/2016 |
| CN | 106645435 | A | | 5/2017 |
| JP | H5-220146 | A | | 8/1993 |
| JP | H08-062192 | A | | 3/1996 |
| JP | H08-320359 | A | | 12/1996 |
| JP | H11-070372 | A | | 3/1999 |
| JP | 2008-102071 | A | | 5/2008 |
| JP | 2012-211826 | A | | 11/2012 |
| JP | 2014-018470 | A | | 2/2014 |
| JP | 2018-072284 | A | | 5/2018 |
| JP | 2018-072292 | A | | 5/2018 |
| JP | 2018072285 | A | * | 5/2018 ........... G01N 29/043 |
| TW | 201415056 | A | | 4/2014 |
| WO | WO-03/036241 | A1 | | 5/2003 |
| WO | WO 2012/094298 | A1 | | 7/2012 |
| WO | WO 2014/147413 | A1 | | 9/2014 |
| WO | WO-2015/134816 | A1 | | 9/2015 |
| WO | WO-2018/083883 | A1 | | 5/2018 |
| WO | WO 2018/083904 | A1 | | 5/2018 |
| WO | WO-2018083882 | A1 | * | 5/2018 ............. G01N 29/11 |

OTHER PUBLICATIONS

Wei Xiaoyuan et al, "An automatic optimal excitation frequency tracking method based on digital tracking filters for sandwiched piezoelectric transducers used in broken rail detection", Measurement., vol. 135, Nov. 13, 2018, p. 294-p. 305, XP055963914.

Engholm et al, "Designing and evaluating transducers for narrow-band ultrasonic spectroscopy", NDT&E International, Elsevier, Amsterdam, NL, vol. 40, No. 1, Jan. 1, 2007, p. 49-p. 56, XP005696863.

International Preliminary Report on Patentability mailed Sep. 10, 2021 for PCT/JP2020/003040.

Matsumoto Toru et al. "Current Change Observation of Wiring in Semiconductor Device Using Ultrasonic Stimulation", The 36th NANO Testing Symposium (NANOTS2016) Nov. 9-11, 2016, (with attached English-language translation) (11 pages).

Xiang Li, Zhongqi Liu, et al., "Fundamentals of Ultrasound Diagnosis", People's Health Publishing Hous, Aug. 31, 1980 including English translation.

* cited by examiner

*Fig.4*
(a)
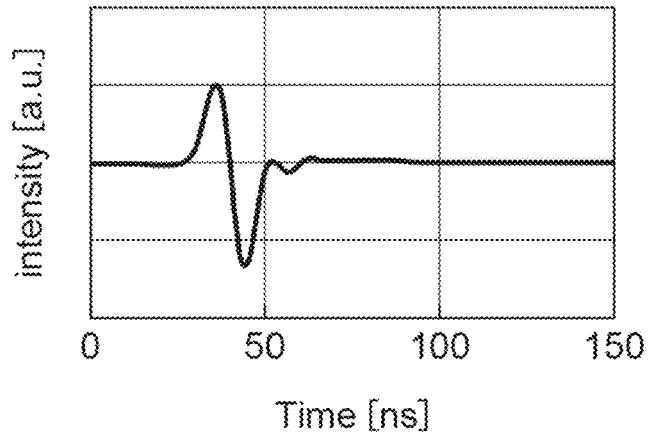
(b)
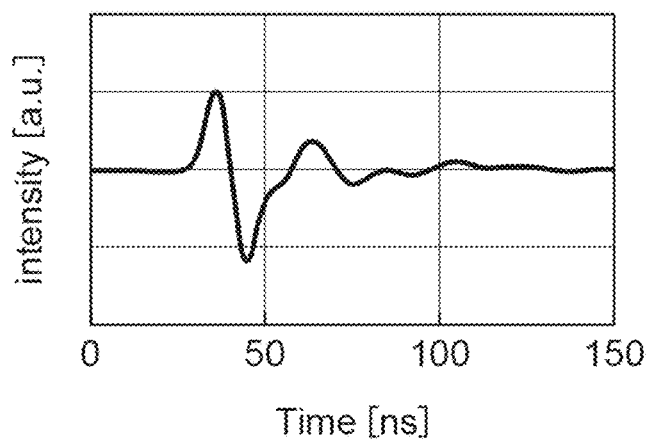
(c)
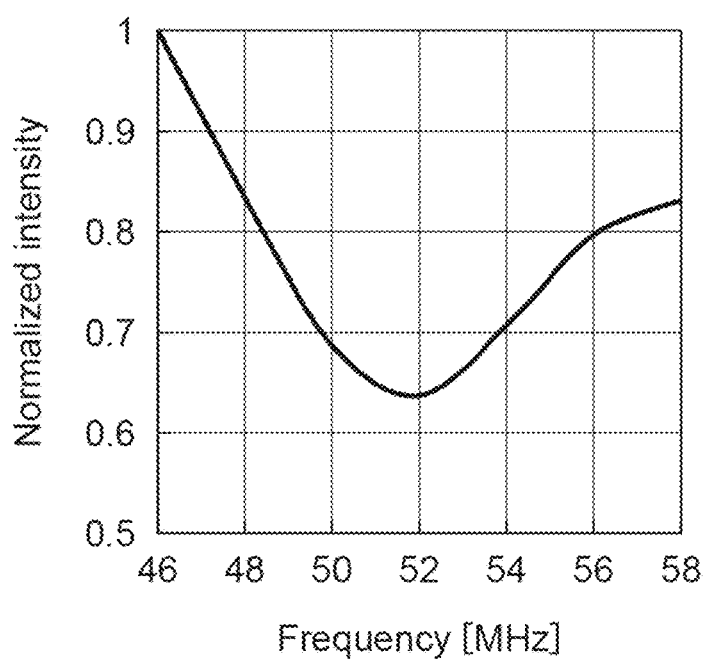

Fig.8
(a) 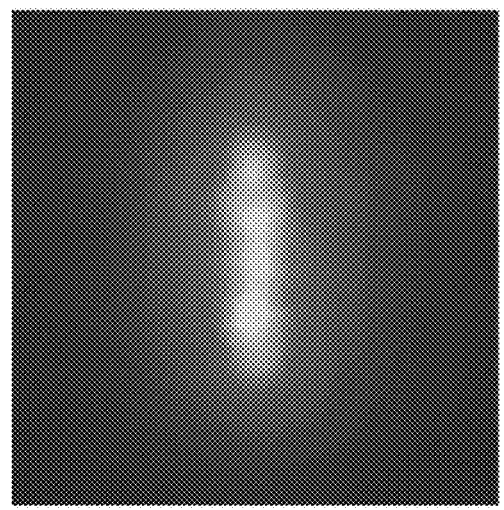
(b) 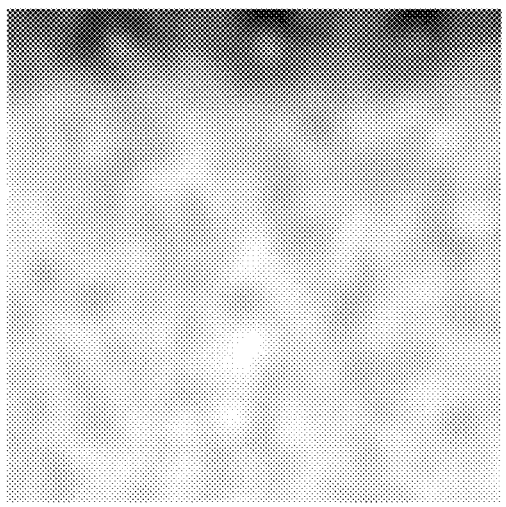
(c) 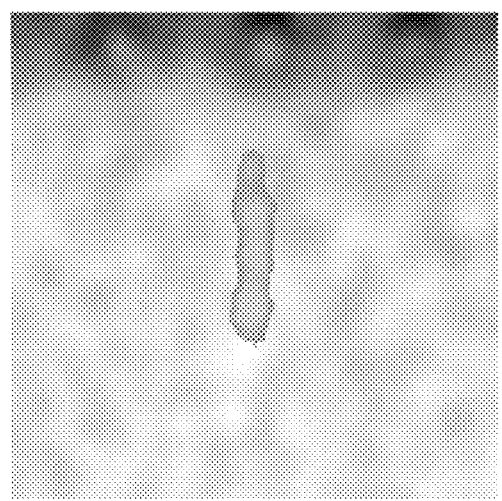

Fig.9
(a) 31A
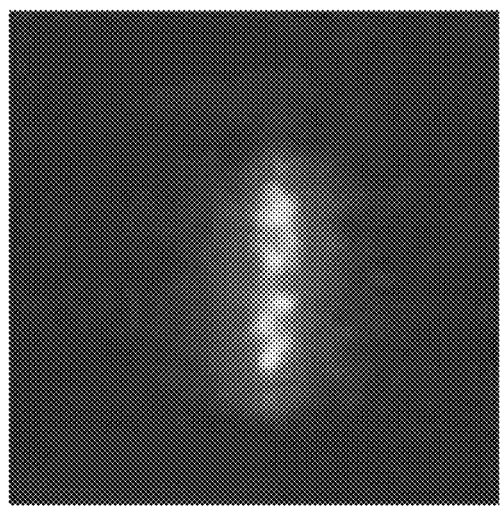
(b) 31B
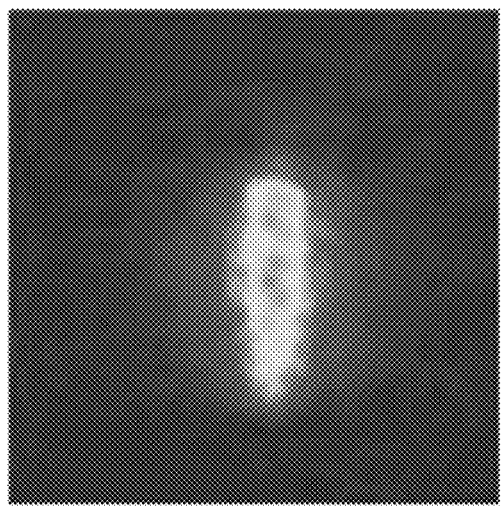
(c) 31C
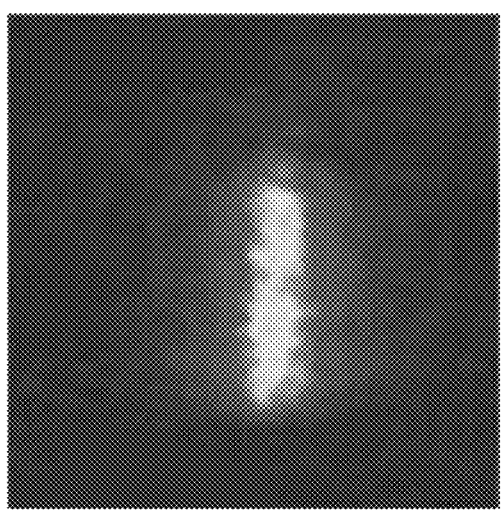

ness of an output signal to be output from a semiconductor device in accordance with the irradiation of the ultrasonic wave is necessary.

ULTRASONIC TESTING DEVICE AND ULTRASONIC TESTING METHOD

TECHNICAL FIELD

The present disclosure relates to an ultrasonic testing device and an ultrasonic testing method.

BACKGROUND ART

Examples of an ultrasonic testing device of the related art include a testing device of a semiconductor integrated circuit wiring system using ultrasonic heating described in Patent Literature 1. In the ultrasonic testing device of the related art, a semiconductor integrated circuit that is a testing subject is irradiated with an ultrasonic wave while power is supplied to the semiconductor integrated circuit from a constant-voltage source. Then, a change in a current flowing through ground wiring is detected in accordance with the irradiation of the ultrasonic wave, and thus, a current image or a fault image of the semiconductor integrated circuit is generated.

CITATION LIST

Patent Literature

Patent Literature 1: Japanese Unexamined Patent Publication No. H8-320359
Patent Literature 2: Japanese Unexamined Patent Publication No. 2018-72284
Patent Literature 3: Japanese Unexamined Patent Publication No. 2018-72285

Non Patent Literature

Non Patent Literature 1: Tooru Matsumoto, Naohiro Hozumi, "Observation of Current Fluctuation in Wiring in Package Due to Ultrasonic Stimulation", The 36th NANO Testing Symposium (NANOTS2016), 9-11 Nov. 2016, p. 235-238

SUMMARY OF INVENTION

Technical Problem

In the ultrasonic testing device of the related art described above, a semiconductor chip ejected from a package is a testing target. However, in consideration of the necessity for an operation of ejecting the semiconductor chip from the package, a possibility that the properties of the circuit may be changed when the semiconductor chip is ejected, or the like, it is preferable that a semiconductor device is tested in a packaged state. In a case where the packaged semiconductor device is tested, there is a problem that the semiconductor chip that is an observation point is not visible from the outside.

Examples of a technology of testing the semiconductor chip in the semiconductor device include a failure analysis technology of a semiconductor device described in Non Patent Literature 1. In addition, examples of a technology of focusing an ultrasonic wave on the semiconductor chip in the semiconductor device include ultrasonic testing devices described in Patent Literatures 2 and 3. From the viewpoint of further improving a testing accuracy, a study for sufficiently increasing the intensity of an output signal to be output from the semiconductor device in accordance with the irradiation of the ultrasonic wave is necessary.

The present disclosure has been made in order to solve the problems described above, and an object thereof is to provide an ultrasonic testing device and an ultrasonic testing method that are capable of sufficiently increasing the intensity of an output signal to be output from a semiconductor device in accordance with the irradiation of an ultrasonic wave.

Solution to Problem

An ultrasonic testing device according to one aspect of the present disclosure is an ultrasonic testing device having a packaged semiconductor device as a testing target, the device including: an ultrasonic oscillator disposed to face the semiconductor device; a signal generation unit generating a driving signal that is used in the generation of an ultrasonic wave to be output from the ultrasonic oscillator; and an analysis unit analyzing an output signal that is output from the semiconductor device in accordance with the incidence of the ultrasonic wave from the ultrasonic oscillator, in which the signal generation unit sets an optimal frequency of the driving signal such that the absorption of the ultrasonic wave in the semiconductor device is maximized.

In such an ultrasonic testing device, the optimal frequency of the driving signal is set such that the absorption of the ultrasonic wave in the semiconductor device is maximized. The driving signal is set to the optimal frequency, and thus, the resonance of the ultrasonic wave can be sufficiently generated in the semiconductor device. For this reason, a focused intensity of the ultrasonic wave increases, and the temperature of the semiconductor device increases in an irradiation position of the ultrasonic wave, and thus, the intensity of the output signal to be output from the semiconductor device in accordance with the irradiation of the ultrasonic wave can be sufficiently increased. A testing accuracy can be improved by increasing the intensity of the output signal.

The signal generation unit may set the optimal frequency of the driving signal on the basis of a reflection frequency spectrum that is obtained by performing Fourier transformation with respect to an intensity time waveform of the ultrasonic wave reflected on a surface of the semiconductor device. According to such an approach, the optimal frequency of the driving signal can be accurately derived in advance without sweeping the frequency of the ultrasonic wave at the time of acquiring the output signal to be output from the semiconductor device in a wide range.

The signal generation unit may set the optimal frequency of the driving signal on the basis of a ratio of the reflection frequency spectrum to an exit frequency spectrum that is obtained by performing Fourier transformation with respect to the intensity time waveform of the ultrasonic wave output from the ultrasonic oscillator. In this case, the optimal frequency of the driving signal can be more accurately derived in advance.

The signal generation unit may set a frequency at which the intensity of the output signal to be output from the semiconductor device is highest in a sweep range as the optimal frequency of the driving signal. In this case, the optimal frequency of the driving signal can be derived by simple processing.

The signal generation unit may generate the driving signal on the basis of mapping information indicating an optimal frequency for each position of a tested region of the semiconductor device. In this case, even when the structure of the tested region of the semiconductor device (a resin thickness, a material, or the like) varies in accordance with the position, the output signal can be constantly analyzed by using the driving signal of the optimal frequency.

The analysis unit may generate an analysis image by mapping an analysis result of the output signal in the tested region of the semiconductor device. Accordingly, a testing result of the semiconductor device can be easily grasped on the basis of the analysis image.

The signal generation unit may generate driving signals of a plurality of frequencies in a constant range including the optimal frequency, and the analysis unit may select an analysis image having the highest SN ratio from a plurality of analysis images generated on the basis of the driving signals of the plurality of frequencies and may output the analysis image to the outside. In this case, even when the structure of the tested region of the semiconductor device (the resin thickness, the material, or the like) varies in accordance with the position, the semiconductor device can be accurately tested on the basis of an analysis image having a high sensitivity.

An ultrasonic testing method according to one aspect of the present disclosure is an ultrasonic testing method having a packaged semiconductor device as a testing target, the method including: an irradiation step of irradiating a semiconductor device with an ultrasonic wave from an ultrasonic oscillator; and an analysis step of analyzing an output signal to be output from the semiconductor device in accordance with the irradiation of the ultrasonic wave from the ultrasonic oscillator, in which in the irradiation step, an optimal frequency of a driving signal for driving the ultrasonic oscillator is set such that the absorption of the ultrasonic wave in the semiconductor device is maximized.

In such an ultrasonic testing method, the optimal frequency of the driving signal is set such that the absorption of the ultrasonic wave in the semiconductor device is maximized. The driving signal is set to the optimal frequency, and thus, the resonance of the ultrasonic wave can be sufficiently generated in the semiconductor device. For this reason, a focused intensity of the ultrasonic wave increases, and the temperature of the semiconductor device increases in an irradiation position of the ultrasonic wave, and thus, the intensity of the output signal to be output from the semiconductor device in accordance with the irradiation of the ultrasonic wave can be sufficiently increased. A testing accuracy can be improved by increasing the intensity of the output signal.

In the irradiation step, the optimal frequency of the driving signal may be set on the basis of a reflection frequency spectrum that is obtained by performing Fourier transformation with respect to an intensity time waveform of the ultrasonic wave reflected on a surface of the semiconductor device. According to such an approach, the optimal frequency of the driving signal can be accurately derived in advance without sweeping the frequency of the ultrasonic wave at the time of acquiring an output signal to be output from the semiconductor device in a wide range.

In the irradiation step, the optimal frequency of the driving signal may be set on the basis of a ratio of the reflection frequency spectrum to an exit frequency spectrum that is obtained by performing Fourier transformation with respect to the intensity time waveform of the ultrasonic wave output from the ultrasonic oscillator. In this case, the optimal frequency of the driving signal can be more accurately derived in advance.

In the irradiation step, the frequency of the driving signal may be swept, and a frequency at which the intensity of the output signal to be output from the semiconductor device is highest in a sweep range may be set as the optimal frequency of the driving signal. In this case, the optimal frequency of the driving signal can be derived by simple processing.

In the irradiation step, the driving signal may be generated on the basis of mapping information indicating an optimal frequency for each position of a tested region of the semiconductor device. In this case, even when the structure of the tested region of the semiconductor device (a resin thickness, a material, or the like) varies in accordance with the position, the output signal can be constantly analyzed by using the driving signal of the optimal frequency.

In the analysis step, an analysis image may be generated by mapping an analysis result of the output signal in the tested region of the semiconductor device. Accordingly, a testing result of the semiconductor device can be easily grasped on the basis of the analysis image.

In the irradiation step, driving signals of a plurality of frequencies may be generated in a constant range including the optimal frequency, and in the analysis step, an analysis image having the highest SN ratio from a plurality of analysis images generated on the basis of the driving signals of the plurality of frequencies may be selected and may be output to the outside. In this case, even when the structure of the tested region of the semiconductor device (the resin thickness, the material, or the like) varies in accordance with the position, the semiconductor device can be accurately tested on the basis of an analysis image having a high sensitivity.

Advantageous Effects of Invention

According to the present disclosure, the intensity of an output signal to be output from a semiconductor device in accordance with the irradiation of an ultrasonic wave can be sufficiently increased.

BRIEF DESCRIPTION OF DRAWINGS

FIG. 4(a) is a diagram showing an example of an intensity time waveform of an output ultrasonic wave, FIG. 4(b) is a diagram showing an example of the intensity time waveform of a reflected ultrasonic wave, and FIG. 4(c) is a diagram showing an example of a ratio of a reflection frequency spectrum to an exit frequency spectrum.

FIG. 8(a) is a diagram showing an example of an analysis image, FIG. 8(b) is a diagram showing an example of a reflection image, and FIG. 8(c) is a diagram showing an example of a superimposition image.

FIG. 9(a) to FIG. 9(c) are diagrams showing an example of a plurality of analysis images acquired by using different carrier frequencies.

DESCRIPTION OF EMBODIMENTS

Hereinafter, a preferred embodiment of an ultrasonic testing device and an ultrasonic testing method according to one aspect of the present disclosure will be described in detail with reference to the drawings.

Figure 1:
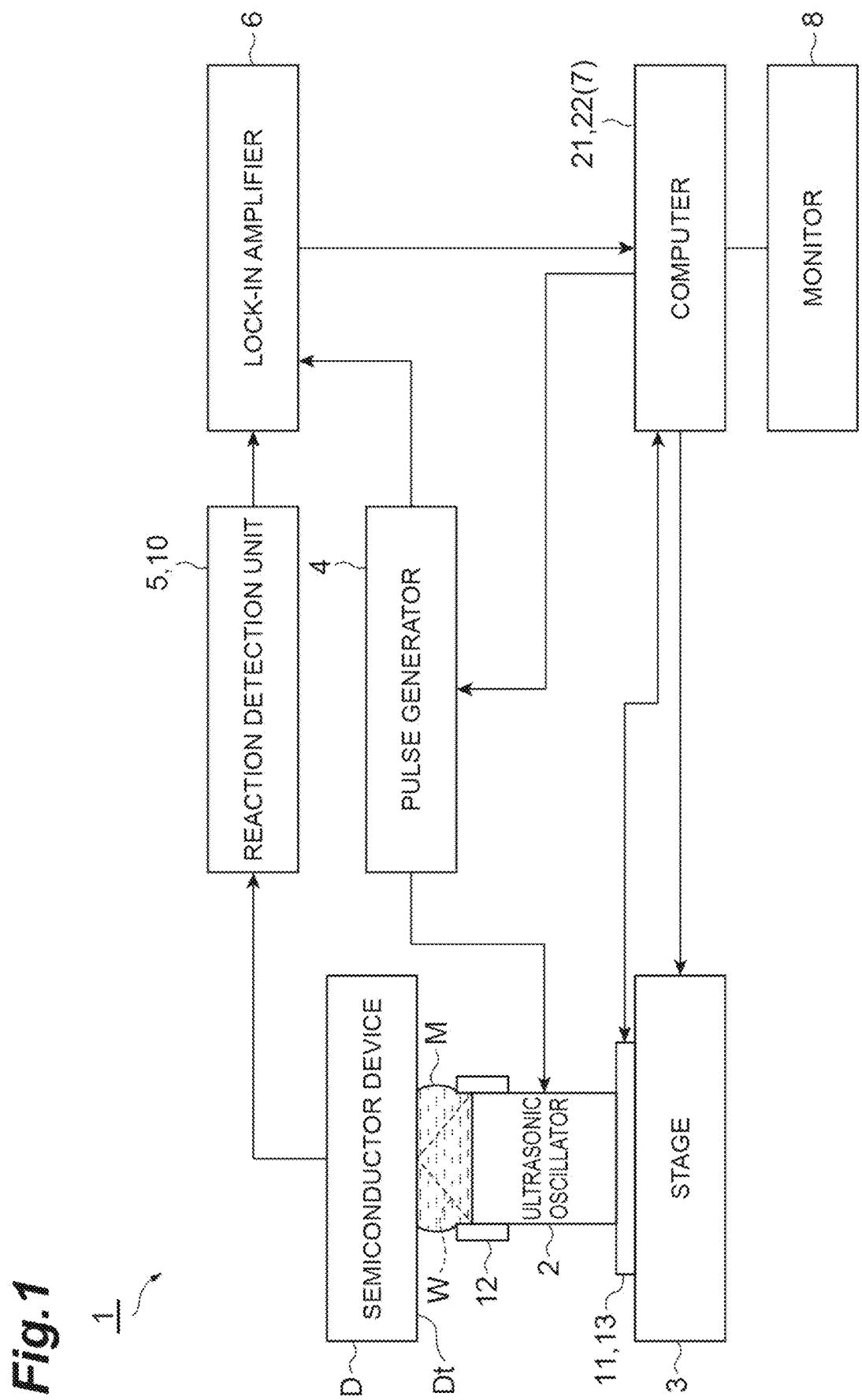
FIG. 1 is a schematic configuration diagram illustrating one embodiment of an ultrasonic testing device.

FIG. 1 is a schematic configuration diagram illustrating one embodiment of an ultrasonic testing device. Such an ultrasonic testing device 1 is a device testing a semiconductor device D that is a testing target in a packaged state. The ultrasonic testing device 1 specifies the presence or absence of a failure of the packaged semiconductor device D, a failure position, and the like, on the basis of a method of measuring a resistance change in the semiconductor device D due to the irradiation of an ultrasonic wave W.

One surface side of the semiconductor device D is a testing surface Dt to be irradiated with the ultrasonic wave W. The semiconductor device D is retained by a retaining plate or the like in a state where the testing surface Dt is directed downward. Examples of the semiconductor device D include an individual semiconductor element (discrete) including a diode, a power transistor, or the like, an optoelectronic element, a sensor/actuator, a logic large scale integration (LSI) including a transistor having a metal-oxide-semiconductor (MOS) structure or a bipolar structure, a memory element, a linear integrated circuit (IC), and a hybrid device thereof. In addition, the semiconductor device D may be a package including a semiconductor device, a composite substrate, and the like.

As illustrated in FIG. 1, the ultrasonic testing device 1 includes an ultrasonic oscillator 2, a stage 3, a pulse generator (a signal generation unit) 4, a reaction detection unit 5, a lock-in amplifier 6, a computer (an analysis unit/image generation unit) 7, and a monitor 8.

Figure 2:
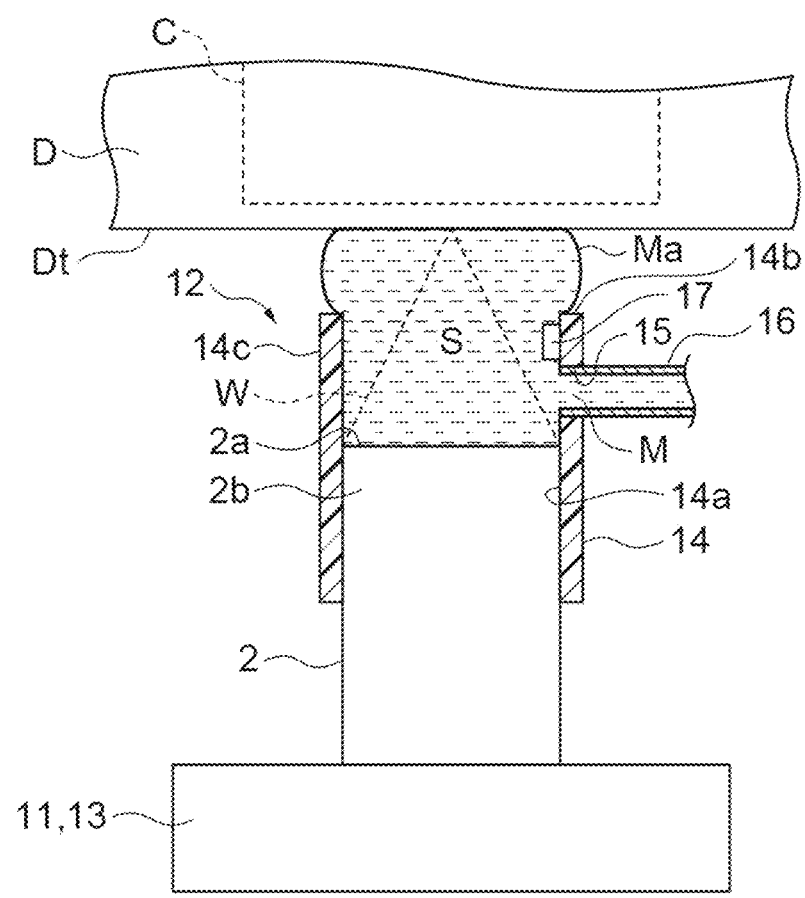
FIG. 2 is a schematic view illustrating a configuration of an ultrasonic oscillator.

The ultrasonic oscillator 2 is a device irradiating the semiconductor device D with the ultrasonic wave W. As illustrated in FIG. 2, the ultrasonic oscillator 2 includes a pulser 11 and a medium retaining portion 12. The ultrasonic oscillator 2, for example, is formed in a tubular shape, and more specifically, is formed in a cylindrical shape. A tip end surface 2a of the ultrasonic oscillator 2 is a portion that outputs the ultrasonic wave W and is disposed upwardly to face the testing surface Dt of the semiconductor device D. The tip end surface 2a is practically formed in a concave surface shape, and the ultrasonic wave W generated in each position of the tip end surface 2a has a focal point in a position separated from the tip end surface 2a by a constant distance.

The ultrasonic wave W to be output from the tip end surface 2a, for example, is an elastic oscillatory wave of approximately 20 kHz to 10 GHz. The waveform of the ultrasonic wave W is not particularly limited insofar as the waveform is a pulse waveform having a sufficient band. The waveform of the ultrasonic wave W is not limited to the pulse waveform, and may be a swept burst waveform. In addition, the burst waveform may include a chirp waveform of which the frequency is locally swept.

The pulser 11 is a portion that drives the ultrasonic oscillator 2 on the basis of a driving signal to be output from the pulse generator 4. In this embodiment, the pulser 11 also has a function as a receiver 13 that detects the ultrasonic wave W reflected on the testing surface of the semiconductor device D. The receiver 13 detects a reflection wave of the ultrasonic wave W and outputs a detection signal indicating a detection result to the computer 7.

The medium retaining portion 12 is a portion that retains a medium M between the ultrasonic oscillator 2 and the semiconductor device D. In this embodiment, the medium M retained by the medium retaining portion 12 is water. The medium M is not particularly limited insofar as the medium has impedance matched with the impedance of a material that is used in a package of the semiconductor device D, and other liquids such as glycerin, a gelled or jellied substance, or the like may be used. The medium retaining portion 12, for example, includes a tubular member 14 formed of a material having sufficient flexibility and sufficient wettability with respect to the medium M, such as a silicone resin. The tubular member 14 is detachably fitted into an end portion 2b of the ultrasonic oscillator 2 on the tip end surface 2a side.

The tubular member 14 is slidably fitted into the end portion 2b such that a part of the tubular member 14 protrudes from the tip end surface 2a, and thus, a retaining space S is formed in which the medium M is retained by an inner circumferential surface 14a of the tubular member 14 and the tip end surface 2a of the ultrasonic oscillator 2. The volume of the retaining space S is variable by adjusting a protrusion amount of the tubular member 14 from the tip end surface 2a of the ultrasonic oscillator 2. Accordingly, even in the case of a semiconductor device D of a package having a different resin thickness, an optimal volume of the retaining space S in which the medium M does not spill over can be set. In addition, the range of a focal point position of the ultrasonic wave W to be output from the ultrasonic oscillator 2 can be adjusted by adjusting the protrusion amount of the tubular member 14.

In order to easily grasp the protrusion amount of the tubular member 14, a scale may be provided in the tubular member 14. A position in which the scale is provided, for example, is the inner circumferential surface 14a or an outer circumferential surface 14c of the tubular member 14. The protrusion amount of the tubular member 14 can be adjusted by manually sliding the position of the tubular member 14 with respect to the end portion 2b of the ultrasonic oscillator 2 and by changing a fitting amount of the tubular member 14. The position of the tubular member 14 with respect to the end portion 2b of the ultrasonic oscillator 2 may be adjusted by using a sliding mechanism. In addition, the protrusion amount of the tubular member 14 may be adjusted by setting the fitting amount of the tubular member 14 to be constant, and then, by replacing the tubular member 14 with a tubular member 14 having a different length.

A medium flowing port 15 adjusting a retaining amount of the medium M that is retained in the retaining space S is provided in a circumferential wall portion of the tubular member 14. A flowing tube 16 connected to an outer medium storage portion (not illustrated) is inserted into the medium flowing port 15 such that the medium M flows into the retaining space S and the medium M is discharged from the retaining space S. A flowing amount of the medium M, for example, is controlled by the computer 7.

It is preferable that the medium flowing port 15 is provided at fixed intervals from the tip end surface 14b of the tubular member 14. Accordingly, even in a case where impurities are mixed in the medium M flowing from the medium flowing port 15, the aggregation of the impurities in the vicinity of the tip end surface 14b of the tubular member 14 in the retaining space S can be suppressed. The ultrasonic wave W is focused more in the vicinity of the tip end surface 14b of the tubular member 14 than in the vicinity of the tip end surface 2a of the ultrasonic oscillator 2. For this reason, the aggregation of the impurities in the vicinity of the tip end surface 14b is suppressed, and thus, the influence of the interference of the ultrasonic wave W on the impurities is suppressed.

A level sensor (a retaining amount detection unit) 17 detecting the retaining amount of the medium M in the retaining space S is attached to the inner circumferential surface 14a of the tubular member 14. An attachment position of the level sensor 17, for example, is above the medium flowing port 15 (the tip end surface 14b side). The level sensor 17 outputs a detection signal indicating a detection result to the computer 7. The amount of the medium M in the retaining space S at the time of adjusting the focal point position of the ultrasonic wave W is controlled on the basis of the detection signal from the level sensor 17. A distance sensor detecting a distance with respect to the semiconductor device D may be attached to the tubular member 14. Accordingly, when the stage 3 described below is driven in a Z-axis direction, interference between the tubular member 14 and the semiconductor device D can be prevented.

As illustrated in FIG. 1, the stage 3 is a device moving a relative position between the semiconductor device D and the ultrasonic oscillator 2. In this embodiment, the stage 3 is configured as a triaxial stage that can be driven in XYZ-axis directions, and the ultrasonic oscillator 2 is fixed onto the stage 3. The driving of the stage 3 is controlled on the basis of an instruction signal from the computer 7. The stage 3 is driven in an in-plane direction (XY-axis directions) of the testing surface Dt of the semiconductor device D, and thus, an irradiation position of the ultrasonic wave W on the testing surface Dt of the semiconductor device D is scanned. In addition, the stage 3 is driven in a thickness direction of the semiconductor device D (the Z-axis direction), and thus, the focal point position of the ultrasonic wave W is adjusted with respect to the thickness direction of the semiconductor device D with a constant accuracy. Note that, the stage 3 may be fixed to the semiconductor device D but not the ultrasonic oscillator 2.

Figure 3:
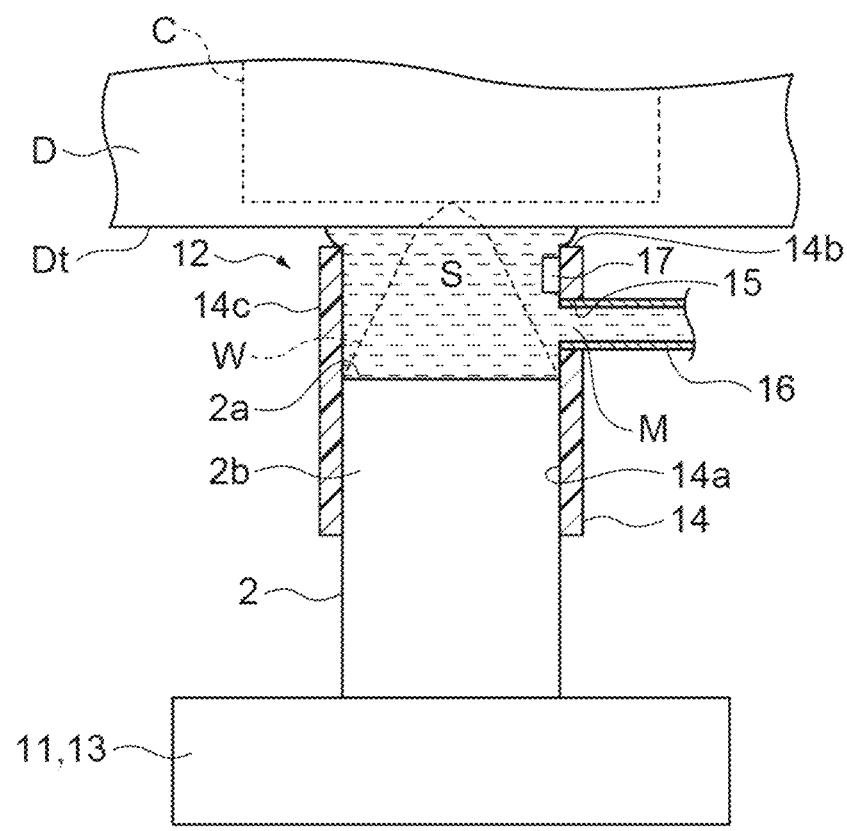
FIG. 3 is a schematic view illustrating a focal point position of an ultrasonic wave at the time of executing a test.

As illustrated in FIG. 2, when the test of the semiconductor device D starts, the medium M is supplied to the retaining space S to be raised from the retaining space S of the medium retaining portion 12 by a surface tension. Then, the stage 3 is driven in the thickness direction of the semiconductor device D, and thus, a raised portion Ma of the medium M is brought into contact with the testing surface Dt of the semiconductor device D. Accordingly, the path of the ultrasonic wave W from the tip end surface 2a of the ultrasonic oscillator 2 to the testing surface Dt of the semiconductor device D is filled with the medium M. Then, as illustrated in FIG. 3, the stage 3 is further driven in the thickness direction of the semiconductor device D, and thus, the focal point position of the ultrasonic wave W is adjusted in the vicinity of a chip C in the semiconductor device D.

The pulse generator 4 is a device generating a driving signal with respect to the ultrasonic oscillator 2. The frequency of the driving signal (hereinafter, referred to as a "carrier frequency") is set to a value that is identical to the frequency of the ultrasonic wave W generated by the ultrasonic oscillator 2. As with this embodiment, in the case of performing lock-in detection using the lock-in amplifier 6, a lock-in frequency is separately set, and a burst signal in which the carrier frequency and the lock-in frequency are synthesized is input to the ultrasonic oscillator 2 as the driving signal. In this case, a reference signal according to the lock-in frequency is output to the lock-in amplifier 6 from the pulse generator 4. The carrier frequency, for example, is approximately 25 MHz to 300 MHz, and the lock-in frequency, for example, is approximately 0.1 kHz to 5 kHz.

In the generation of the driving signal, the pulse generator 4 sets an optimal frequency of the driving signal such that the absorption of the ultrasonic wave W by the resonance in the semiconductor device D is maximized. The pulse generator 4, for example, sets the optimal frequency of the driving signal by analyzing the frequency of the ultrasonic wave W reflected on the surface of the semiconductor device D. In this case, first, a reference sample is set, the irradiation position of the ultrasonic wave W on the testing surface Dt of the sample and the focal point position of the ultrasonic wave W are adjusted, and then, an intensity time waveform T0 (refer to FIG. 4(a)) of the ultrasonic wave W to be output from the ultrasonic oscillator 2 is acquired. It is preferable that the reference sample is an object that is formed of a single material and has a sufficient thickness. In addition, the semiconductor device D that is the testing target is set, and an intensity time waveform T1 (refer to FIG. 4(b)) of the ultrasonic wave W reflected on the surface of the semiconductor device D is acquired.

Next, an exit frequency spectrum W0 is derived by performing Fourier transformation with respect to the intensity time waveform T0, and a reflection frequency spectrum W1 is derived by performing Fourier transformation with respect to the intensity time waveform T1. Then, the reflection frequency spectrum W1 is divided by the exit frequency spectrum W0, and a ratio R of the reflection frequency spectrum W1 to the exit frequency spectrum W0 is calculated. Such a ratio R indicates frequency properties of a reflection rate of the ultrasonic wave W on the surface of the semiconductor device D that is the testing target. FIG. 4(c) is a diagram showing an example of a derivation result of the ratio R of the reflection frequency spectrum W1 to the exit frequency spectrum W0. In the example of FIG. 4(c), the frequency is in a range of 46 MHz to 58 MHz, and in a case where the frequency is 52 MHz, the ratio R is the minimum value. In this case, the pulse generator 4 generates a driving signal having a carrier frequency of 52 MHz at which the ratio R is the minimum value and outputs the driving signal to the ultrasonic oscillator 2. For the exit frequency spectrum W0, data that is acquired in advance by using the reference sample may be stored in the pulse generator 4 or the computer 7.

The optimal frequency may be set by sweeping the carrier frequency. In this case, the semiconductor device D that is the testing target is set, and a reflection intensity waveform (not illustrated) of the ultrasonic wave W reflected on the surface of the semiconductor device D is acquired while the carrier frequency is swept. The pulse generator 4 generates a driving signal having a frequency at which a reflection intensity is the minimum value as the carrier frequency, on the basis of the acquired reflection intensity waveform, and outputs the driving signal to the ultrasonic oscillator 2.

The optimal frequency may be derived by combining a method of sweeping the carrier frequency with a method of using the ratio R of the reflection frequency spectrum W1 to the exit frequency spectrum W0 described above. In this case, for example, the driving signal may be generated by deriving a carrier frequency at which the ratio R is the minimum value, and then, by sweeping the carrier frequency in a predetermined range including the frequency, and by setting a frequency at which a reflection intensity is the minimum value as the carrier frequency. According to such an approach, a sweep range of the carrier frequency at the time of deriving the optimal frequency can be narrowed.

The pulse generator 4 may generate driving signals of a plurality of frequencies in a constant range including the optimal frequency. In a case where the optimal frequency is derived as 52 MHz by the processing described above, the pulse generator 4, for example, may generate the driving signal at an interval of 2 MHz in a range of 48 MHz to 56 MHz. In this case, in the pulse generator 4, driving signals based on five carrier frequencies of 48 MHz, 50 MHz, 52 MHz, 54 MHz, and 56 MHz are generated, and the semiconductor device D is tested by using ultrasonic waves W of the five different frequencies.

Figure 5:
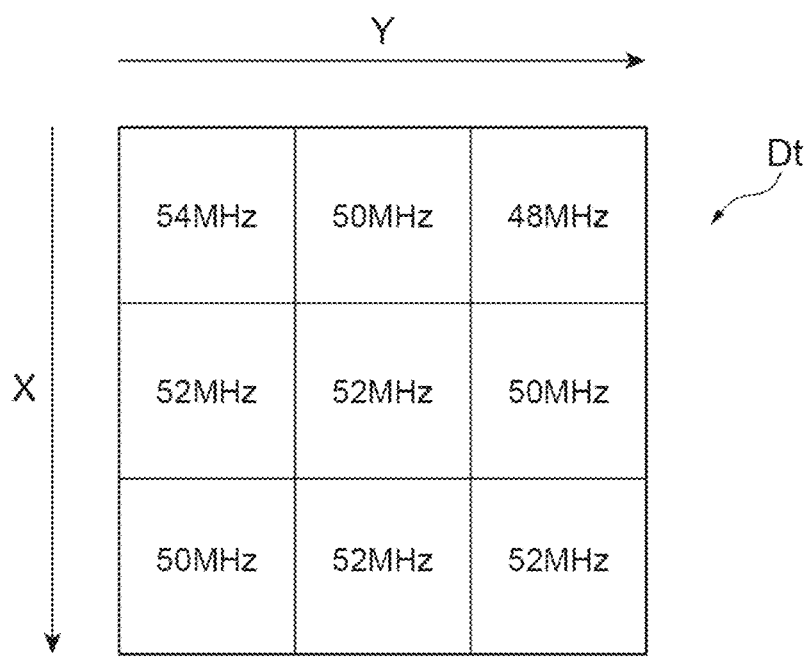
FIG. 5 is a diagram illustrating an example of mapping information of an optimal frequency.

The pulse generator 4 may generate the driving signal on the basis of mapping information indicating an optimal frequency for each position of a tested region of the semiconductor device D. FIG. 5 is a diagram illustrating an example of the mapping information of the optimal frequency. In the example of the same drawing, the tested region on the testing surface Dt of the semiconductor device D is partitioned into nine regions formed in a matrix shape, and the optimal frequency is assigned to each of the regions. The mapping information, for example, is generated by driving the stage 3 in the in-plane direction of the testing surface Dt of the semiconductor device D (the XY-axis directions), and by deriving the optimal frequency for each of the positions of the tested region of the semiconductor device D. The mapping information may be generated for each semiconductor device D, or the mapping information that is generated in advance in accordance with a product specification or the like may be stored in the pulse generator 4 or the computer 7.

The reaction detection unit 5 is a device detecting the reaction of the semiconductor device D according to the irradiation of the ultrasonic wave W from the ultrasonic oscillator 2. The reaction detection unit 5, for example, includes a detection amplifier that is connected to the previous stage of the lock-in amplifier 6. The reaction detection unit 5 is embedded with a power-supply device 10 that applies a constant voltage or a constant current to the semiconductor device D. The reaction detection unit 5 detects the current or the voltage of the semiconductor device D according to the irradiation of the ultrasonic wave W, in a state where the constant voltage or the constant current is applied, and outputs a detection signal indicating a detection result to the lock-in amplifier 6. The reaction detection unit 5 may output the detection signal by extracting only an alternating-current component.

The lock-in amplifier 6 is a device performing lock-in detection with respect to the detection signal that is output from the reaction detection unit 5. The lock-in amplifier 6 performs lock-in detection with respect to the detection signal to be output from the reaction detection unit 5, on the basis of the reference signal to be output from the pulse generator 4. Then, the lock-in amplifier 6 outputs a detection signal indicating a detection result to the computer 7.

The computer 7 physically includes a memory such as a RAM and a ROM, a processor (an operational circuit) such as a CPU, a communication interface, a storage unit such as a hard disk, and a display unit such as the monitor 8. Examples of such a computer 7 include a personal computer, a cloud server, and a smart device (a smart phone, a tablet terminal, and the like). The computer 7 may include a microcomputer, a field-programmable gate array (FPGA), or the like. The computer 7 functions as a stage control unit 21 that controls the movement of the stage 3 and an analysis unit 22 that analyzes the detection signal from the lock-in amplifier 6 by allowing the CPU of a computer system to execute a program stored in the memory.

More specifically, the stage control unit 21 executes adjustment control of the focal point position of the ultrasonic wave W with respect to the thickness direction of the semiconductor device D and scan control of the ultrasonic wave W with respect to the testing surface Dt of the semiconductor device D. In the adjustment control of the focal point position, the stage control unit 21 executes the control of the stage 3 in a Z direction, on the basis of the detection signal to be output from the receiver 13 of the ultrasonic oscillator 2. In the scan control of the ultrasonic wave W, the stage control unit 21 executes the control of the stage 3 in XY directions such that the ultrasonic wave W is moved along the testing surface Dt of the semiconductor device D. The stage control unit 21 sequentially outputs position information of the stage 3 in the scan control to the analysis unit 22.

Figure 6:
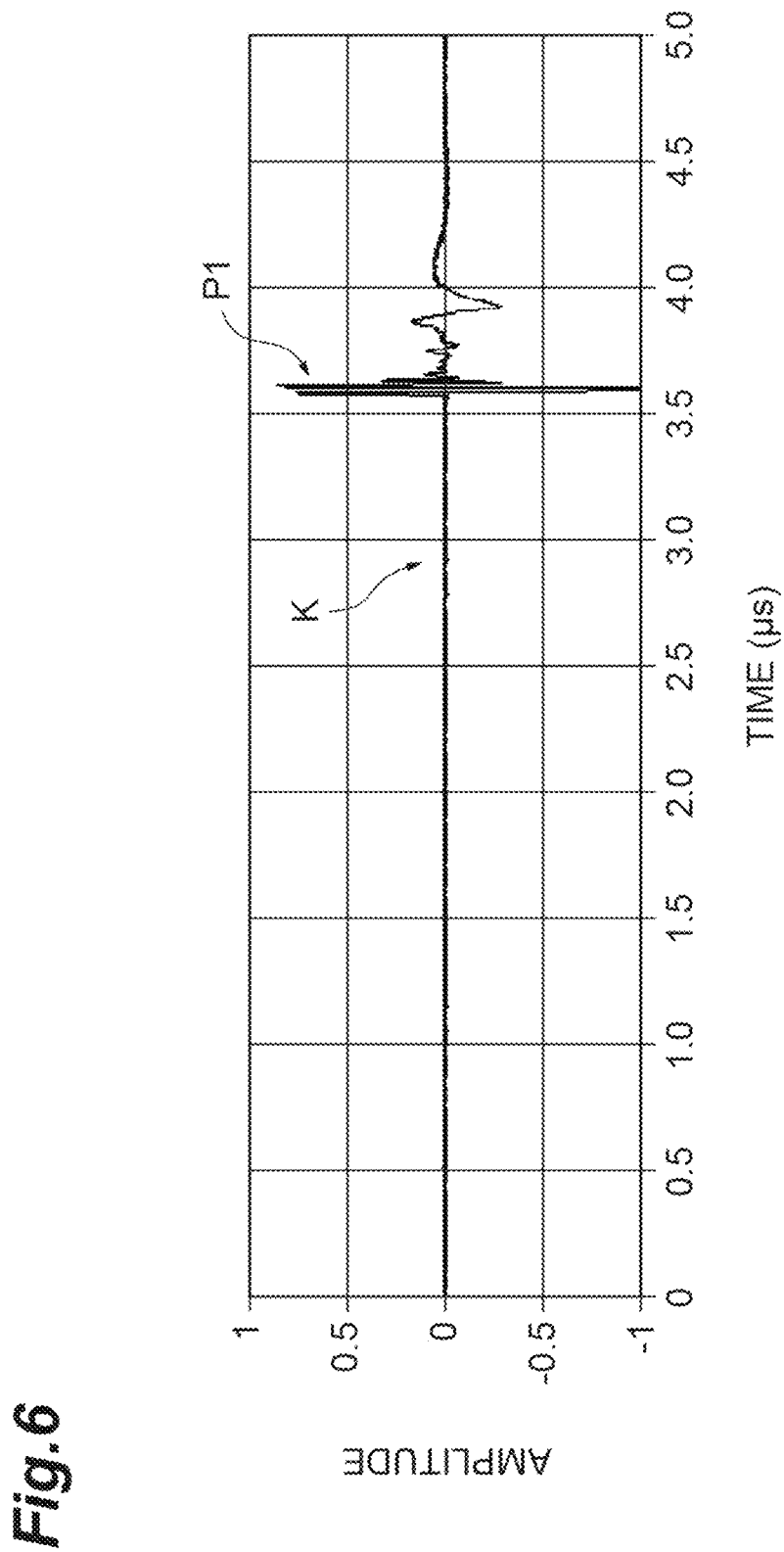
FIG. 6 is a diagram showing an example of adjustment control of a focal point position of the ultrasonic wave.

FIG. 6 is a diagram showing an example of the adjustment control of the focal point position. In the example of the same drawing, a horizontal axis is a time (a time from when the ultrasonic wave W is output to when the reflection wave is detected), a vertical axis is an amplitude, and a time waveform K of the detection signal from the receiver 13 is plotted. Such a time waveform K may be obtained by integrating the detection signals of the reflection waves in a case where the ultrasonic wave W is output a plurality of times.

Figure 7:
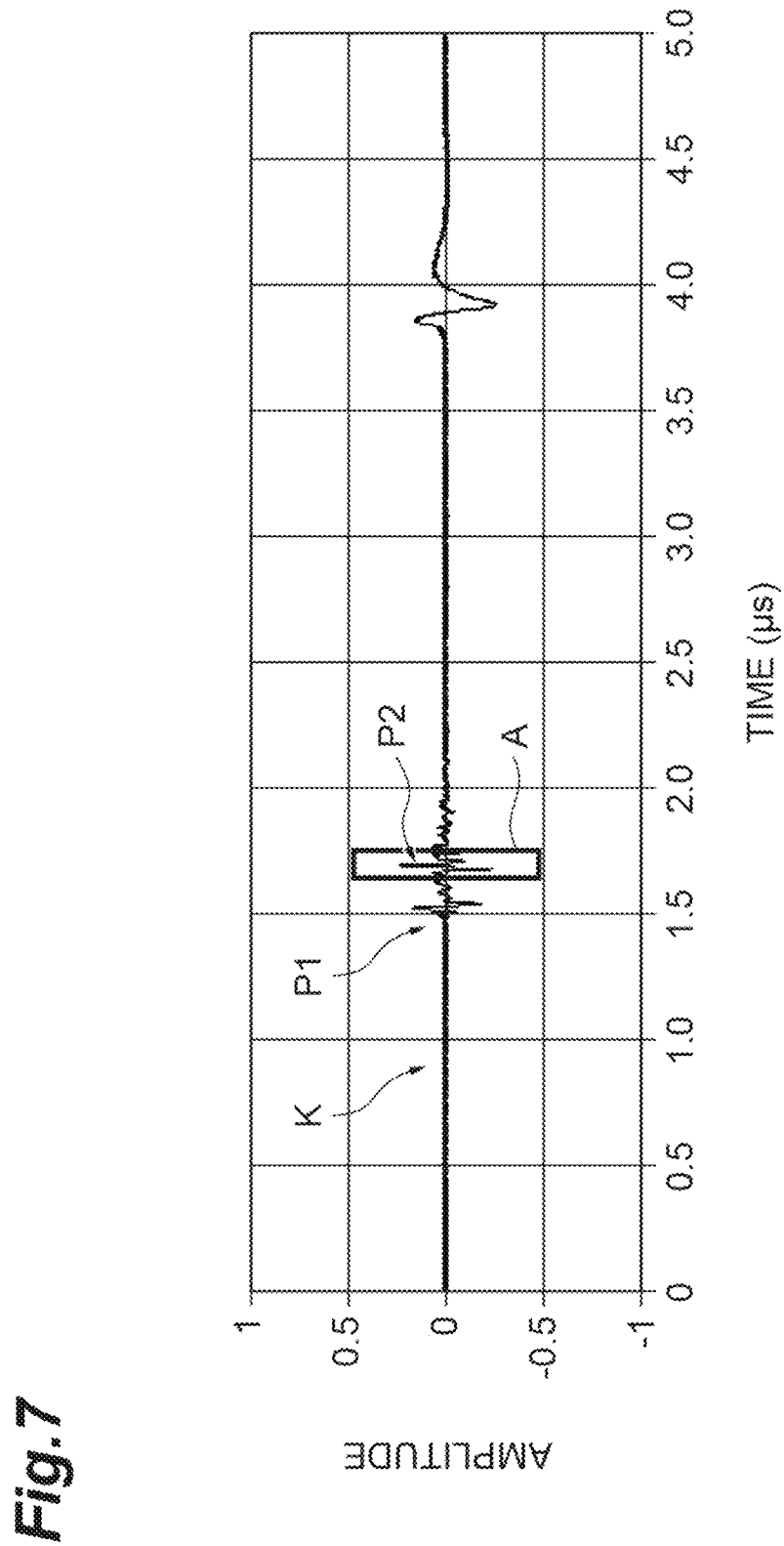
FIG. 7 is a diagram showing a subsequent state of FIG. 6.

In a case where the focal point position of the ultrasonic wave W is displaced toward the semiconductor device D, as shown in FIG. 6, a first peak P1 corresponding to the reflection on the surface of the package of the semiconductor device D appears in the time waveform K. In a case where the focal point position of the ultrasonic wave W is further displaced to the semiconductor device D side from a position in which the first peak P1 appears, the focal point position of the ultrasonic wave W is moved into the package of the semiconductor device D, and as shown in FIG. 7, a second peak P2 corresponding to the reflection on the surface of the chip C in the semiconductor device D appears in the time waveform K. Therefore, the stage control unit 21 controls the position of the stage 3 in the Z-axis direction such that the amplitude of the second peak P2 is maximized.

In the adjustment control of the focal point position, a case where the resin thickness of the package is known, or a case where the resin composition of the package is known and a sonic speed of the ultrasonic wave W in the package can be calculated is considered. In such a case, a detection window A at the time of detecting the second peak P2 may be set by calculating the range of an appearance position (an appearance time) of the second peak P2 in advance, on the basis of such information. By setting the detection window A, a detection accuracy of the appearance position of the second peak P2 can be improved and a detection time can be shortened. In a case where it is known that the chip C including a plurality of layers is embedded in the semiconductor device D, the position of the stage 3 in the Z-axis direction may be controlled on the basis of peaks subsequent to the second peak P2.

As shown in FIG. 8(a), the analysis unit 22 generates an analysis image 31 by mapping the detection signal to be output from the lock-in amplifier 6 during the test of the semiconductor device D, on the basis of the position information of the stage 3 that is output from the stage control unit 21. In the analysis image 31, the range of a display luminance, a color, a transmittance, or the like according to the reaction (a change amount in the current or the voltage) of the semiconductor device D can be arbitrarily set.

As shown in FIG. 8(*b*), the analysis unit 22 generates a reflection image 32 by mapping the detection signal to be output from the receiver 13 during the test of the semiconductor device D, on the basis of the position information of the stage 3 that is output from the stage control unit 21. In the generation of the reflection image 32, it is preferable that only a time component corresponding to the reflection wave from the surface of the chip C in the semiconductor device D is extracted from the detection signals from the receiver 13. Accordingly, the reflection image 32 representing the shape of the chip C in the semiconductor device D can be obtained.

As shown in FIG. 8(*c*), the analysis unit 22 may generate a superimposition image 33 in which the analysis image 31 is superimposed on the reflection image 32. The analysis unit 22 outputs the generated superimposition image 33 to the monitor 8. In the superimposition image 33, the reaction of the semiconductor device D represented by the analysis image 31 is superimposed on the shape of the chip C in the semiconductor device D represented by the reflection image 32, and thus, the failure position of the chip C is easily specified. In the reflection image 32, not only the shape of the chip C but also the abnormality such as the peeling of the circuit may be checked. Therefore, in the superimposition image 33, in a case where the abnormal position that can be checked from the analysis image 31 is superimposed on the abnormal position that can be checked from the reflection image 32, the abnormal position may be emphatically displayed.

In a case where the pulse generator 4 generates the driving signals of the plurality of frequencies in a constant range including the optimal frequency, and the semiconductor device D is tested by using the ultrasonic waves W of different frequencies, the analysis unit 22 generates a plurality of analysis images 31 based on the driving signals of the plurality of frequencies. In this case, the analysis unit 22 selects an analysis image 31 having the highest SN ratio from the plurality of generated analysis images 31 and outputs the analysis image 31 to the outside.

In the example of FIG. 9, an analysis image 31A in a case where the carrier frequency is 48 MHz (FIG. 9(*a*)), an analysis image 31B in a case where the carrier frequency is 52 MHz (FIG. 9(*b*)), and an analysis image 31C in a case where the carrier frequency is 56 MHz (FIG. 9(*c*)) are shown (in FIG. 9, an analysis image in a case where the carrier frequency is 50 MHz and an analysis image in a case where the carrier frequency is 54 MHz are omitted). In the SN ratio of the image, for example, a signal point and a noise point in the analysis image are designated, and the SN ratio is calculated on the basis of a signal intensity ratio at the points.

Figure 10:
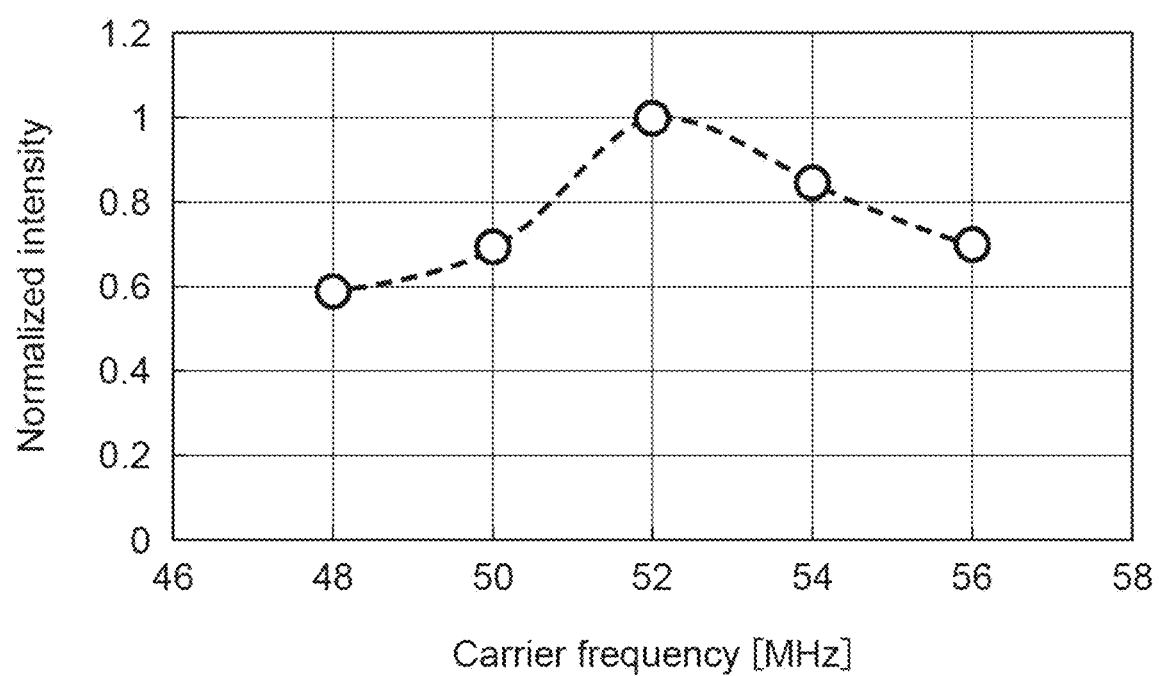
FIG. 10 is a diagram showing an example of a calculation result of an SN ratio of the plurality of analysis images.

FIG. 10 is a diagram showing an example of a calculation result of the SN ratio of the plurality of analysis images. In the example of the same drawing, the analysis image having the highest SN ratio is an analysis image in a case where the carrier frequency is 52 MHz. In this case, the analysis unit 22 selects the analysis image in a case where the carrier frequency is 52 MHz from the plurality of analysis images. Then, the analysis unit 22 generates the superimposition image by superimposing the reflection image on the selected analysis image and outputs the superimposition image to the monitor 8.

Subsequently, an ultrasonic testing method of using the ultrasonic testing device 1 described above will be described.

Figure 11:
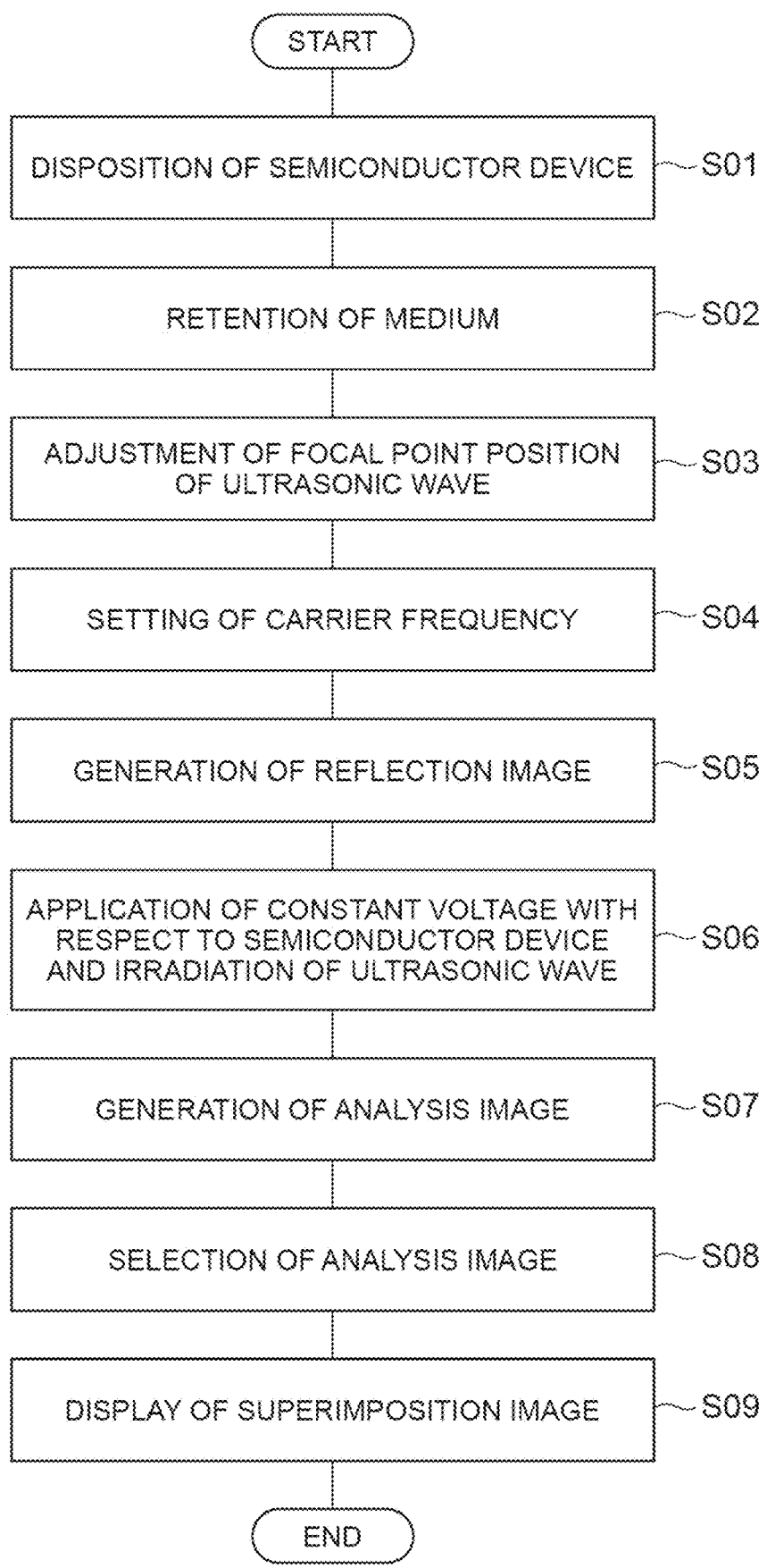
FIG. 11 is a flowchart illustrating an example of an ultrasonic testing method.

FIG. 11 is a flowchart illustrating an example of the ultrasonic testing method. As illustrated in the same drawing, in a case where the semiconductor device D is tested by using the ultrasonic testing device 1, first, the semiconductor device D is disposed on the retaining plate or the like that is not illustrated (step S01). Next, the medium M flows into the medium retaining portion 12 from the medium flowing port 15, and the medium M is retained in the retaining space S (step S02). In step S02, as described above, the raised portion Ma of the medium M is formed by a surface tension. Then, in a state where the tip end surface 14*b* of the tubular member 14 is not brought into contact with the testing surface Dt of the semiconductor device D, but only the raised portion Ma of the medium M is brought into contact with the testing surface Dt of the semiconductor device D, the stage 3 is driven in the Z-axis direction (refer to FIG. 2).

The focal point position of the ultrasonic wave W is adjusted after the medium M is retained (step S03). Here, first, the stage 3 is driven in the X-axis direction and the Y-axis direction such that the ultrasonic oscillator 2 is positioned to face the chip C. Next, the stage 3 is driven in the Z-axis direction such that the focal point position of the ultrasonic wave W is coincident with the surface of the chip C in the semiconductor device D, on the basis of the appearance position of the second peak P2 of the time waveform K of the reflection wave of the ultrasonic wave W to be output from the receiver 13 (refer to FIG. 3). The focal point position of the ultrasonic wave W may be automatically adjusted by the stage control unit 21, or may be manually adjusted while the appearance position of the second peak P2 of the time waveform K is visually checked by a user of the ultrasonic testing device 1.

A step of adjusting the inclination of the semiconductor device D may be executed after the focal point position of the ultrasonic wave W is adjusted. In such a step, for example, the posture of the retaining plate or the stage 3 is adjusted such that the time waveforms K of the reflection waves at the time of driving the stage 3 in the X-axis direction and the Y-axis direction one axis by one axis are coincident with each other. Such a step may be automatically executed by the stage control unit 21, or may be manually executed while the time waveform K is visually checked by the user of the ultrasonic testing device 1.

An irradiation step of irradiating the semiconductor device D with the ultrasonic wave W from the ultrasonic oscillator 2 is executed after the focal point position of the ultrasonic wave W is adjusted. In the irradiation step, first, the carrier frequency of the driving signal to be input to the ultrasonic oscillator 2 is set (step S04). Here, the optimal frequency of the driving signal is set such that the absorption of the ultrasonic wave W in the semiconductor device D is maximized by a method of using the ratio R of the reflection frequency spectrum W1 to the exit frequency spectrum W0 described above, a method of sweeping the carrier frequency, or a combination of the methods. In step S04, the driving signals of the plurality of frequencies in a constant range including the optimal frequency may be generated, or the driving signal may be generated on the basis of the mapping information indicating the optimal frequency for each of the positions of the tested region of the semiconductor device D.

The reflection image of the semiconductor device D is generated after the optimal frequency is set (step S05). In step S05, the driving signal generated in step S04 is input to the ultrasonic oscillator 2 from the pulse generator 4, and the semiconductor device D is irradiated with the ultrasonic wave W from the ultrasonic oscillator 2. Then, the reflection wave from the semiconductor device D is detected by the receiver 13, and mapping is performed on the basis of the detection signal output from the receiver 13 and the position information of the stage 3 to be output from the stage control unit 21, and thus, the reflection image 32 is generated.

A constant voltage (or a constant current) is applied to the semiconductor device D after the analysis position is checked on the basis of the reflection image 32, and the irradiation of the ultrasonic wave W is performed (step S06). In step S06, a constant voltage (or a constant current) is applied to the semiconductor device D from the power-supply device 10. In addition, the driving signal is input to the ultrasonic oscillator 2 from the pulse generator 4, and the semiconductor device D is irradiated with the ultrasonic wave W from the ultrasonic oscillator 2. Then, the stage 3 is driven in the XY-axis directions, and a change in the current or the voltage of the semiconductor device D according to the irradiation of the ultrasonic wave W is detected in each position on the testing surface Dt of the semiconductor device D. The change in the current or the voltage of the semiconductor device D is detected by the reaction detection unit 5, and the AC component of the detection signal is output to the lock-in amplifier 6 from the reaction detection unit 5. In the lock-in amplifier 6, lock-in detection based on the detection signal output from the reaction detection unit 5 and the reference signal output from the pulse generator 4 is performed, and the detection signal is output to the analysis unit 22.

An analysis step of analyzing the output signal to be output from the semiconductor device in accordance with the irradiation of the ultrasonic wave W from the ultrasonic oscillator 2 (here, the detection signal to be output from the lock-in amplifier 6) is executed after the irradiation step. In the analysis step, the analysis image 31 is generated on the basis of the detection signal of the lock-in detection (step S07). That is, the analysis image 31 is generated by mapping the detection signal output from the lock-in amplifier 6 during the test of the semiconductor device D, on the basis of the position information of the stage 3 to be output from the stage control unit 21.

In a case where in step S04, the driving signals of the plurality of frequencies are generated in a constant range including the optimal frequency, in step S07, the plurality of analysis images 31 based on the driving signals of the plurality of frequencies are generated. In this case, each signal point and each noise point in the plurality of analysis images 31 are designated, and the SN ratio of the image is calculated on the basis of the signal intensity ratio at the points. Then, the analysis image 31 having the highest SN ratio is selected from the plurality of generated analysis images 31 (step S08). The superimposition image 33 in which the analysis image 31 is superimposed on the reflection image 32 is generated after the analysis image 31 is generated, and the superimposition image 33 is displayed on the monitor 8 (step S09).

As described above, in the ultrasonic testing device 1, the optimal frequency of the driving signal is set such that the absorption of the ultrasonic wave W in the semiconductor device D is maximized. The driving signal is set to the optimal frequency, and thus, the resonance of the ultrasonic wave W can be sufficiently generated in the semiconductor device D. Such an optimal frequency can also be referred to as a resonance frequency. For this reason, a focused intensity of the ultrasonic wave W increases, and the temperature of the semiconductor device D in the irradiation position of the ultrasonic wave W increases, and thus, the intensity of the output signal to be output from the semiconductor device D in accordance with the irradiation of the ultrasonic wave W can be sufficiently increased. By increasing the intensity of the output signal, the sensitivity of the analysis image 31 can be sufficiently ensured and a testing accuracy can be improved.

In the ultrasonic testing device 1, the optimal frequency of the driving signal is set on the basis of the ratio R of the reflection frequency spectrum W1 that is obtained by performing Fourier transformation with respect to the intensity time waveform T1 of the ultrasonic wave W reflected on the surface of the semiconductor device D to the exit frequency spectrum W0 that is obtained by performing Fourier transformation with respect to the intensity time waveform T0 of the ultrasonic wave W output from the ultrasonic oscillator 2. According to such an approach, the optimal frequency of the driving signal can be accurately derived without sweeping the frequency W in a wide range. In addition, in the ultrasonic testing device 1, a frequency at which the intensity of the output signal is highest in the sweep range is set as the optimal frequency of the driving signal. According to such an approach, the optimal frequency of the driving signal can be derived by simple processing.

In the ultrasonic testing device 1, the driving signal is generated on the basis of the mapping information indicating the optimal frequency for each of the positions of the tested region of the semiconductor device D. In this case, even when the structure of the tested region of the semiconductor device D (the resin thickness, the material, or the like) varies in accordance with the position, output signal can be constantly analyzed by using the driving signal of the optimal frequency.

In the ultrasonic testing device 1, the analysis image 31 is generated by mapping the analysis result of the output signal in the tested region of the semiconductor device D. Accordingly, a testing result of the semiconductor device D can be easily grasped on the basis of the analysis image 31. In addition, in the ultrasonic testing device 1, the driving signals of the plurality of frequencies are generated in a constant range including the optimal frequency, and the analysis image 31 having the highest SN ratio is selected from the plurality of generated analysis images 31, on the basis of the driving signals of the plurality of frequencies, and is output to the outside. Accordingly, even when the structure of the tested region of the semiconductor device D (the resin thickness, the material, or the like) varies in accordance with the position, the semiconductor device D can be accurately tested on the basis of the analysis image 31 having a high sensitivity.

The present disclosure is not limited to the embodiment described above. For example, in the ultrasonic testing device 1 described above, the semiconductor device D is retained in a state where the testing surface Dt is directed downward and is disposed upward such that the tip end surface 2*a* of the ultrasonic oscillator 2 faces the testing surface Dt, but a disposition relationship between the semiconductor device D and the ultrasonic oscillator 2 is not limited thereto. For example, the semiconductor device D may be retained in a state where the testing surface Dt is directed upward and may be disposed downward such that the tip end surface 2*a* of the ultrasonic oscillator 2 faces the testing surface Dt.

In addition, in the ultrasonic testing device 1 described above, the optimal frequency of the driving signal is derived on the basis of the ratio R of the reflection frequency spectrum W1 to the exit frequency spectrum W0, but in order to simplify operational processing, the optimal frequency of the driving signal may be derived on the basis of only the reflection frequency spectrum W1. In this case, for example, in the reflection frequency spectrum W1, a frequency at which a spectrum intensity is minimized may be set as the optimal frequency of the driving signal.

REFERENCE SIGNS LIST

1: ultrasonic testing device, 2: ultrasonic oscillator, 4: pulse generator (signal generation unit), 22: analysis unit, 31: analysis image, D: semiconductor device, W: ultrasonic wave.

The invention claimed is:

1. An ultrasonic testing device having a packaged semiconductor device as a testing target, the device comprising:
   an ultrasonic oscillator configured to be disposed to face the semiconductor device;
   a signal generator configured to generate a driving signal that is used in generation of an ultrasonic wave to be output from the ultrasonic oscillator; and
   an analyzer configured to analyze an output signal that is output from the semiconductor device in accordance with irradiation of the ultrasonic wave from the ultrasonic oscillator,
   wherein the signal generator sets an optimal frequency of the driving signal such that absorption of the ultrasonic wave in the semiconductor device is maximized,
   wherein the analyzer generates an analysis image by mapping an analysis result of the output signal in the tested region of the semiconductor device,
   wherein the signal generator generates driving signals of a plurality of frequencies in a constant range including the optimal frequency, and
   wherein the analyzer selects an analysis image having the highest SN ratio from a plurality of analysis images generated on the basis of the driving signals of the plurality of frequencies and outputs the analysis image to the outside.

2. The ultrasonic testing device according to claim 1, wherein the signal generator sets the optimal frequency of the driving signal on the basis of a reflection frequency spectrum that is obtained by performing Fourier transformation with respect to an intensity time waveform of the ultrasonic wave reflected on a surface of the semiconductor device.

3. The ultrasonic testing device according to claim 2, wherein the signal generator sets the optimal frequency of the driving signal on the basis of a ratio of the reflection frequency spectrum to an exit frequency spectrum that is obtained by performing Fourier transformation with respect to the intensity time waveform of the ultrasonic wave output from the ultrasonic oscillator.

4. The ultrasonic testing device according to claim 1, wherein the signal generator sweeps the frequency of the driving signal and sets a frequency at which an intensity of the output signal to be output from the semiconductor device is highest in a sweep range as the optimal frequency of the driving signal.

5. The ultrasonic testing device according to claim 1, wherein the signal generator generates the driving signal on the basis of mapping information indicating an optimal frequency for each position of a tested region of the semiconductor device.

6. An ultrasonic testing method having a packaged semiconductor device as a testing target, the method comprising:
   irradiating the semiconductor device with an ultrasonic wave from an ultrasonic oscillator; and
   analyzing an output signal that is output from the semiconductor device in accordance with the irradiation of the ultrasonic wave from the ultrasonic oscillator,
   wherein in the irradiation, an optimal frequency of a driving signal for driving the ultrasonic oscillator is set such that absorption of the ultrasonic wave in the semiconductor device is maximized,
   wherein in the analyzing, an analysis image is generated by mapping an analysis result of the output signal in the tested region of the semiconductor device,
   wherein in the irradiation, driving signals of a plurality of frequencies are generated in a constant range including the optimal frequency, and
   wherein in the analyzing, an analysis image having the highest SN ratio is selected from a plurality of analysis images generated on the basis of the driving signals of the plurality of frequencies and is output to the outside.

7. The ultrasonic testing method according to claim 6, wherein in the irradiation, the optimal frequency of the driving signal is set on the basis of a reflection frequency spectrum that is obtained by performing Fourier transformation with respect to an intensity time waveform of the ultrasonic wave reflected on a surface of the semiconductor device.

8. The ultrasonic testing method according to claim 7, wherein in the irradiation, the optimal frequency of the driving signal is set on the basis of a ratio of the reflection frequency spectrum to an exit frequency spectrum that is obtained by performing Fourier transformation with respect to the intensity time waveform of the ultrasonic wave output from the ultrasonic oscillator.

9. The ultrasonic testing method according to claim 6, wherein in the irradiation, the frequency of the driving signal is swept, and a frequency at which an intensity of the output signal to be output from the semiconductor device is highest in a sweep range is set as the optimal frequency of the driving signal.

10. The ultrasonic testing method according to claim 6, wherein in the irradiation, the driving signal is generated on the basis of mapping information indicating an optimal frequency for each position of a tested region of the semiconductor device.

* * * * *